United States Patent [19]

Egawa

[11] Patent Number: 4,547,790

[45] Date of Patent: Oct. 15, 1985

[54] SEMICONDUCTOR DEVICE HAVING CONTACTING BUT ELECTRICALLY ISOLATED REGIONS OF OPPOSITE CONDUCTIVITY TYPES

[75] Inventor: Hideharu Egawa, Tokyo, Japan

[73] Assignee: Tokyo Shibaura Denki Kabushiki Kaisha, Japan

[21] Appl. No.: 637,704

[22] Filed: Aug. 6, 1984

Related U.S. Application Data

[63] Continuation of Ser. No. 265,590, May 20, 1981, abandoned.

[30] Foreign Application Priority Data

May 20, 1980 [JP] Japan ................................. 55-66971
May 20, 1980 [JP] Japan ................................. 55-66972

[51] Int. Cl.[4] ..................... H01L 29/06; H01L 27/02; H01L 27/04; H01L 29/78
[52] U.S. Cl. .......................................... 357/42; 357/20; 357/23.7; 357/23.12; 357/41; 357/48; 357/86; 307/246; 307/279
[58] Field of Search ...................... 357/20, 23.7, 23.12, 357/40, 41, 42, 48, 86; 307/245-248, 279

[56] References Cited

U.S. PATENT DOCUMENTS

| | | | |
|---|---|---|---|
| 3,840,888 | 10/1974 | Gaensslen et al. | 357/420 R |
| 4,035,829 | 7/1977 | Ipri et al. | 357/49 |
| 4,045,693 | 8/1977 | Ester | 307/445 |
| 4,107,548 | 8/1978 | Sakaba et al. | 357/23 D |
| 4,161,745 | 7/1979 | Slob | 357/68 |
| 4,231,055 | 10/1980 | Iizuka | 357/42 |
| 4,292,548 | 9/1981 | Suarez et al. | 307/448 |
| 4,318,015 | 3/1982 | Schade, Jr. | 307/279 |
| 4,320,312 | 3/1982 | Walker et al. | 307/304 X |
| 4,377,819 | 3/1983 | Sakai et al. | 357/23 TF |
| 4,395,726 | 7/1983 | Maeguchi | 357/42 |

FOREIGN PATENT DOCUMENTS

| | | | |
|---|---|---|---|
| 53-78784 | 7/1978 | Japan | 357/42 |
| 54-72640 | 6/1979 | Japan | 357/42 |
| 55-03602 | 1/1980 | Japan | 357/42 |

OTHER PUBLICATIONS

P. J. Krick, "Complementary MNOS Electronically Alterable Read–Only Memory", *IBM Technical Disclosure Bulletin*, vol. 13, No. 1, (1970), pp. 263–264.

Y. Nishi et al., The SOS Large Scale IC: Its Current Status and Future Possibilities, 217 *Nikkei Electronics*, 110-32 (Jul. 23, 1979).

"Complementary Four Device FET Memory Cell", F. Gaensslen, *IBM Technical Disclosure Bulletin*, vol. 13, No. 12, May 1971, pp. 3614–3615.

"CMOS on Sapphire", Smith et al., Around the IC Loop, 8167 *Computer Design*, vol. 17, No. 9 (1978), pp. 194 and 196.

Primary Examiner—Andrew J. James
Assistant Examiner—J. Carroll
Attorney, Agent, or Firm—Finnegan, Henderson, Farabow, Garrett & Dunner

[57] ABSTRACT

A semiconductor device includes p- and n-type semiconductor layers formed on an insulating substrate and gate electrodes selectively and insulatively formed over the respective p- and n-type semiconductor layers and forming D-type MOS transistors. In this semiconductor device, the p- and n-type semiconductor layers are made in contact with each other, and negative and positive power supply terminals which are respectively set at negative and positive potentials are respectively connected to the p- and n-type semiconductor layers thereby to electrically isolate the p-type and n-type semiconductor layers from each other.

30 Claims, 31 Drawing Figures

SEMICONDUCTOR DEVICE HAVING CONTACTING BUT ELECTRICALLY ISOLATED REGIONS OF OPPOSITE CONDUCTIVITY TYPES

This application is a continuation of application Ser. No. 265,590, filed May 20, 1981 now abandoned.

This invention relates to semiconductor devices and more particularly to semiconductive devices having p-n junctions.

A semiconductor device having a silicon-on-sapphire (SOS) structure in which a semiconductor element is formed in a semiconductor layer formed on an insulating substrate for the purposes of increasing the density of an MOS semiconductor integrated circuit and improving the characteristics thereof is well known in the art. The merits of this SOS semiconductor device using an insulating substrate over the conventional semiconductor device using a semiconductor substrate are that the floating capacitance is small, thus permitting the improvement of frequency characteristics. Also the component elements can be readily insulated from one another by a small space so that it is possible to increase the integration density.

Where CMOS transistors are formed by using an ordinary semiconductor substrate, a well region of a conductivity type different from that of the semiconductor substrate is formed therein, and source and drain regions are formed in the surface area of the well region. In this case, the MOS transistors have to be sufficiently spaced apart to effect electric insulation from one another. Where CMOS transistors are formed by using an insulating substrate, semiconductor layers of different conductivity type are formed in a spaced-apart relation to one another on the insulating substrate, and then source and drain regions are formed in the surface area of the individual semiconductor layers. In this case, the individual semiconductor layers of the different conductivity type need by spaced apart only slightly to effect their electric insulation, and thus the integration density can be greatly improved compared to the case where a semiconductor substrate is used. However, even with this SOS semiconductor device a separation space has to be provided between the MOS transistors for electrically separating them, and this separation space usually occupies more than 50% of the entire area of the semiconductor chip and therefore imposes considerable restrictions upon the increase of integration density.

An object of the invention is to provide a semiconductor device, with which it is possible to obtain a high density of integration.

To achieve this object, the semiconductor device according to the invention comprises an insulation substrate formed of substantially an insulating material, a p-type semiconductor region formed on the insulating substrate and constituting at least part of a first semiconductor circuit section, an n-type semiconductor region formed on the insulating substrate and constituting at least part of a second semiconductor circuit section, the p-type semiconductor region being arranged partly in contact with the n-type semiconductor region, first potential setting means connected to the p-type semiconductor region for setting the p-type semiconductor region at a first predetermined operation potential, and second potential setting means connected to the n-type semiconductor region for setting the n-type semiconductor region at a second predetermined operation potential, the second predetermined operation potential being greater than the first predetermined operation potential, thereby electrically isolating the p-type and n-type regions from each other.

With this construction, where the p- and n-type semiconductor regions are formed on the insulating substrate such that they are in contact with each other, the integration density can be improved. Also, since a reverse bias voltage is applied between the p- and n-type semiconductor regions, the p- and n-type semiconductor regions are electrically isolated in effect, although they are at least partly in contact with each other.

In another aspect of the invention a semiconductor device comprises an insulating body formed of substantially an insulated material, a p-type semiconductor region formed on the insulation body and constituting at least part of a first semiconductor circuit section, an n-type semiconductor region formed on the insulation body and constituting at least part of a second semiconductor circuit section, the n-type semiconductor region being at least partly in contact with the p-type semiconductor region, first potential setting means connected to the p-type semiconductor region for setting the p-type semiconductor region at a first predetermined operation potential, and second potential setting means connected to the n-type semiconductor region for setting the n-type semiconductor region at a second predetermined operation potential, the second predetermined operation potential being lower than the first predetermined operation potential by an amount smaller than the contact potential difference at the junction between the p- and n-type semiconductor regions, thereby electrically isolating the p-type and n-type semiconductor regions from each other.

With this construction, where the p- and n-type semiconductor regions are formed on the insulating substrate such that they are at least partly in contact with each other, the integration density can be improved. Also, a forward voltage lower than the contact potential difference at the junction between the p- and n-type semiconductor regions is applied between the p- and n-type semiconductor regions, and the p- and n-type semiconductor regions are thus electrically separated from each other, although they are at least partly in contact with each other.

This invention can be more fully understood from the following detailed description when taken in conjunction with the accompanying drawings, in which.

Figure 1:
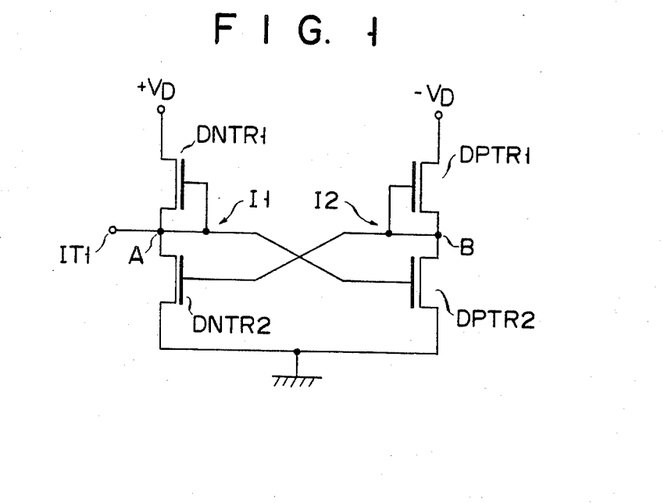
FIG. 1 is a circuit diagram showing a first embodiment of a semiconductor device according to the invention.

FIG. 1 shows an embodiment of the invention applied to a semiconductor circuit formed as a flip-flop circuit. This flip-flop circuit includes depletion type (D-type) n-channel MOS transistors DNTR1 and DNTR2 with their current paths connected in series between a positive power supply terminal $+V_D$ and ground and D-type p-channel MOS transistors DPTR1 and DPTR2 with their current paths connected in series between a negative power supply terminal $-V_D$ and ground. In this circuit, the MOS transistors DNTR1 and DPTR1 constitute respective load elements, and the MOS transistors DNTR2 and DPTR2 constitute respective driver elements. In other words, the MOS transistors DNTR1 and DPTR1 constitute a first inverter I1, and the MOS transistors DPTR1 and DPTR2 constitute a second inverter I2. The output terminal A of the inverter I1 is connected to the gate of the MOS transistor DPTR2 while the output terminal B of the inverter I2 is connected to the gate of the MOS transistor DNTR2, thus forming the flip-flop.

In the circuit shown in FIG. 1, when a positive voltage signal or signal "1" is applied to an input terminal IT1, the MOS transistor DPTR2 is rendered nonconductive to negatively bias the output terminal B of the inverter I2. Thus, the MOS transistor DNTR2 is rendered nonconductive so that the output terminal A of the inverter I1 is stably held at a positive potential. This output state of the flip-flop is held even after the input signal is removed. When a signal "0" is applied to the input terminal IT1, the MOS transistor DPTR2 is rendered conductive to hold the output terminal B of the inverter I2 substantially at 0 V. Thus, the MOS transistor DNTR2 is held conductive to hold the output terminal A of the inverter I1 substantially at the ground potential. This output state of the flip-flop is held even after the input signal is removed. With the flip-flop circuit of FIG. 1, the amplitude of each of the output voltages from the inverters I1 and I2 can be made high by setting the absolute value of the threshold voltage of the MOS transistors DNTR1 and DPTR1 to be smaller than the absolute value of the threshold voltage of the MOS transistors DNTR2 and DPTR2.

Figure 2:
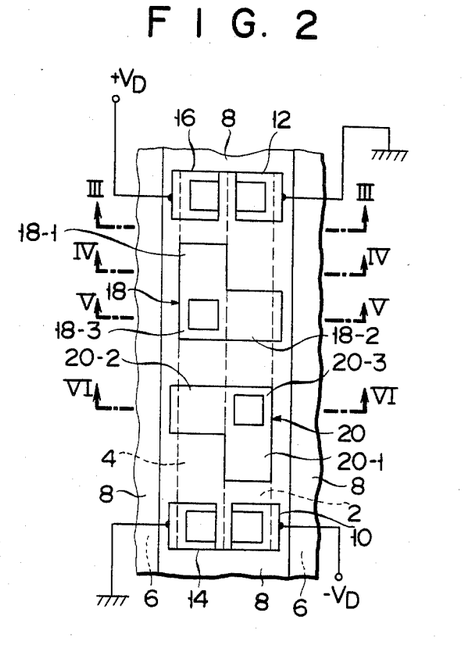
FIG. 2 is a schematic plan view of the first embodiment of the semiconductor device shown in FIG. 1.
Figure 3:
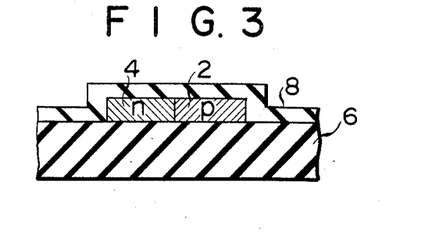
FIGS. 3 to 6 are sectional views taken along lines III—III to VI—VI in FIG. 2, respectively.
Figure 4:
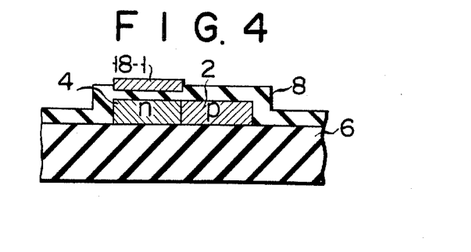
Figure 5:
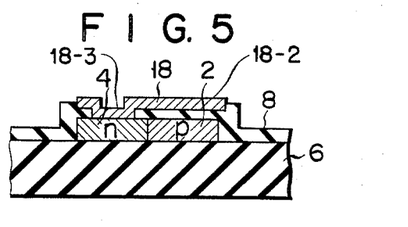

FIG. 2 is a plan view of an SOS semiconductor device in which the flip-flop shown in FIG. 1 is realized on the basis of the technical concept according to the invention. FIGS. 3 to 6 are sectional views of the semiconductor device taken along lines III—III, IV—IV, V—V and VI—VI in FIG. 2. As is clearly shown in FIG. 3, for instance, the semiconductor device includes a sapphire substrate 6, p-type and n-type semiconductor layers 2 and 4, respectively formed on the substrate 6 and in contact therewith and also in contact with each other, and an insulating film 8 formed to cover the semiconductor layers 2 and 4 and substrate 6. Further, electrodes 10 and 12 are formed in electric contact with the opposite ends of the p-type semiconductor layer 2 and respectively connected to the negative power supply terminal $-V_D$ and ground, and electrodes 14 and 16 are formed in electrical contact with those ends of the n-type semiconductor layer 4 which are positioned respectively adjacent the electrodes 10 and 12, and respectively connected to the ground and positive power supply terminal $+V_D$.

Conductive layers 18 and 20 are formed on the central portions of the semiconductor layers 2 and 4. The conductive layer 18 has a gate electrode 18-1 insulatively formed over the n-type semiconductor layer 4 and covering the entire width thereof, a gate electrode 18-2 insulatively formed over the p-type semiconductor layer 2 and covering the entire width thereof, and a contact electrode 18-3 connecting the gate electrodes 18-1 and 18-2 and formed partly in contact with the n-type semiconductor layer 4, as clearly shown in FIGS. 4 and 5. The conductive layer 20 has a gate electrode 20-1 insulatively formed over the p-type semiconductor layer 2 and covering the entire width thereof, a gate electrode 20-2 insulatively formed over the n-type semiconductor layer 4 and covering the entire width thereof, and a contact electrode 20-3 connecting the gate electrodes 20-1 and 20-2 and formed partly in contact with the p-type semiconductor layer 2, as clearly shown in FIG. 6.

The gate electrodes 18-1, 18-2, 20-1 and 20-2 respectively constitute the gates of the MOS transistors DNTR1, DPTR2, DPTR1 and DNTR2. The drain and source of the MOS transistor DNTR1 are respectively constituted by the n-type semiconductor region between the electrodes 16 and 18-1 and the n-type semiconductor region beneath the electrode 18-3. The drain and source of the MOS transistor DNTR2 are respectively constituted by the n-type semiconductor region between the electrodes 18-3 and 20-2 and the n-type semiconductor region between the electrodes 20-2 and 14. The drain and source of the MOS transistor DPTR1 are respectively constituted by the p-type semiconductor region between the electrodes 10 and 20-1, and the p-type semiconductor region beneath the electrode 20-3. The drain and source of the MOS transistor DPTR2 are respectively constituted by the p-type semiconductor region between the electrodes 20-3 and 18-2 and the p-type semiconductor region between the electrodes 18-2 and 12.

It is to be noted that the n-type semiconductor layer 4 which is the main element of the inverter I1 is connected between the positive power supply terminal $+V_D$ and ground, and the p-type semiconductor layer 2 which is the main element of the inverter I2 is connected between the ground and negative power supply terminal $V_D$ so that the p- and n-type semiconductor layers 2 and 4 can be formed in contact with each other on the sapphire substrate 6. Even with this construction, since the reverse bias voltage is applied across the juncture between the p- and n-type semiconductor layers 2 and 4 by a suitable potential setting means in the operation of the flip-flop circuit, these semiconductor layers are in effect electrically isolated from each other. Here, the term "potential setting means" should be construed to mean either a voltage source supplying a desired voltage or leads and/or voltage transfer elements for transmitting a desired voltage. That is, there is no possibility of mutual interference of the inverters I1 and I2, though the p- and n-type semiconductor layers 2 and 4 are formed in contact with each other. Thus, the area occupied by the semiconductor device shown in FIG. 2 can be reduced 30 to 60% in comparison with the conventional SOS type semiconductor device corresponding to the circuit shown in FIG. 1, permitting high integration density.

FIGS. 7A to 7E show the steps for manufacturing the semiconductor device shown in FIGS. 2 to 6.

Figure 7A:
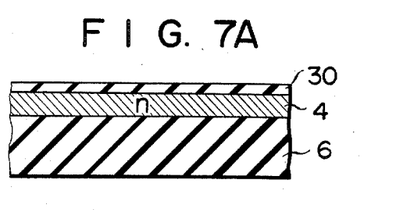
FIGS. 7A to 7E are views showing steps for manufacturing the semiconductor device shown in FIGS. 2 to 6.
Figure 7B:
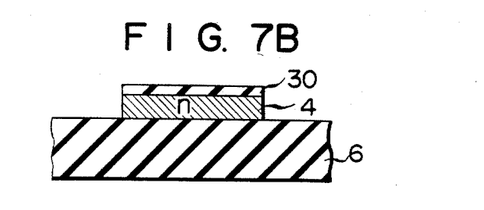
Figure 7C:
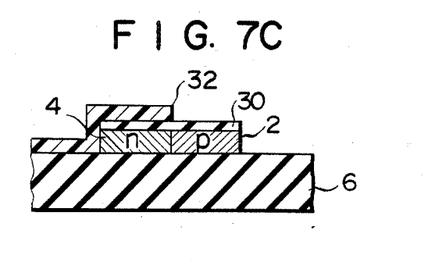
Figure 7D:
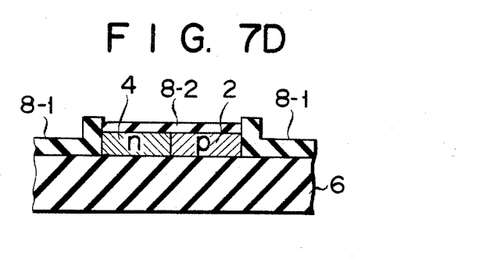
Figure 7E:
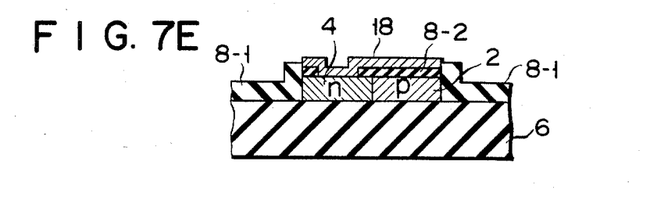

First, an n-type silicon layer 4 is formed by the epitaxial growth method on a sapphire substrate 6 as shown in FIG. 7A. Then, a silicon oxide ($SiO_2$) layer 30 is formed by the thermal oxidation method on the silicon layer 4. Subsequently, the silicon layer 4 and $SiO_2$ layer 30 is selectively removed by the photolithographic method to form an island as shown in FIG. 7B. Thereafter, a photoresist layer 32 is formed to cover part of the $SiO_2$ layer 30, and then boron is selectively implanted into the silicon layer 4 with the photoresist layer 32 used as a mask to form a p-type silicon layer 2 as shown in FIG. 7C. Then, the photoresist layer 32 and $SiO_2$ layer 30 are removed. Thereafter, a field oxide film 8-1 is formed by the chemical vapor deposition (CVD) method as shown in FIG. 7D. Then, portions of the field oxide film 8-1 corresponding to gate regions and contact regions are selectively removed by the photolithographic technique, and a gate oxide film 8-2 is formed on the exposed regions. Then, the gate oxide film 8-2 is selectively removed by the photolithographic method to form contact regions, and aluminum is deposited on the entire surface of the wafer. Subsequently, the aluminum layer is selectively removed by the photolithographic technique to form a conductive layer 18 as shown in FIG. 7E. The sectional view of FIG. 7E, showing the semiconductor device, substantially corresponds to that of FIG. 5.

Figure 8:
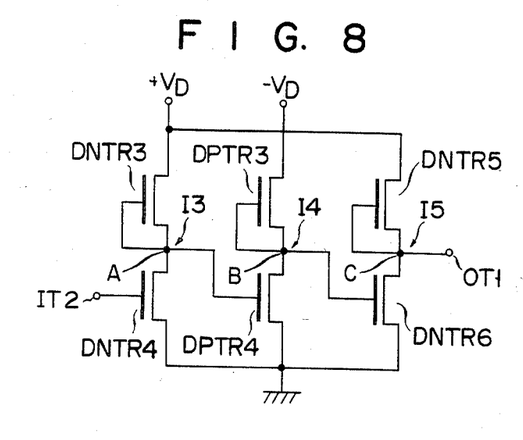
FIG. 8 is a circuit diagram showing a second embodiment of a semiconductor device according to the invention.

FIG. 8 shows a second embodiment of the semiconductor circuit according to the invention. This semiconductor circuit has three cascade-connected inverters I3, I4 and I5. The inverter I3 includes D-type n-channel MOS transistors DNTR3 and DNTR4 with the current paths thereof connected in series between a positive power supply terminal $+V_D$ and ground; the inverter I4 includes D-type p-channel MOS transistors DPTR3 and DPTR4 with the current paths thereof connected in series between a negative power supply terminal $-V_D$ and ground; and the inverter I5 includes D-type n-channel MOS transistors DNTR5 and DNTR6 with the current paths thereof connected between the positive power supply terminal $+V_D$ and ground. An input terminal IT2 is connected to the gate of the MOS transistor DNTR4, the output terminal A of the inverter I3 is connected to the gate of the MOS transistor DPTR4, the output terminal B of the inverter I4 is connected to the gate of the MOS transistor DNTR6, and the output terminal C of the inverter I5 is connected to an output terminal OT1 of this semiconductor circuit.

In the semiconductor circuit shown in FIG. 8, when a negative voltage is applied to the input terminal IT2, the MOS transistor DNTR4 is rendered nonconductive, causing a positive voltage to be generated from the inverter I3 to render the MOS transistor DPTR4 nonconductive. As a result, a negative voltage is generated from the inverter I4 to render the MOS transistor DNTR6 nonconductive, thus causing the inverter I5 to produce a positive voltage signal. When a zero voltage is applied to the input terminal IT2, the MOS transistors DNTR4, DPTR4 and DNTR6 all remain conductive, and thus a zero voltage is generated from the inverter I5.

In the semiconductor circuit shown in FIG. 8, the amplitude of the output voltage obtained from each inverter when the driver MOS transistor thereof is turned ON and OFF by the input signal can be made large by setting the absolute value of the threshold voltage of the load MOS transistor of the inverter, for instance, MOS transistor DNTR3, at a value smaller than the absolute value of the threshold voltage of the driver MOS transistor, for instance, MOS transistor DNTR4.

Figure 9:
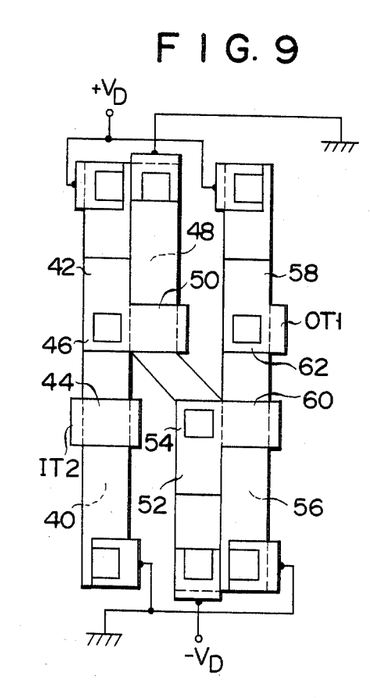
FIG. 9 is a schematic plan view of the second embodiment of the semiconductor device shown in FIG. 8.

FIG. 9 shows a schematic plan view pattern of a semiconductor device corresponding to the circuit shown in FIG. 8. The inverter I3 includes an n-type semiconductor layer 40 connected at the opposite ends thereof to the positive power supply terminal $+V_D$ and ground, gate electrodes 42 and 44 insulatively formed over the semiconductor layer 4 and spaced apart from each other, and a contact electrode 46 formed integrally with the gate electrode 42 and in electric contact with the semiconductor layer 40. The inverter I4 includes a p-type semiconductor layer 48 having the opposite ends thereof connected to the negative power supply terminal $-V_D$ and ground, gate electrodes 50 and 52 insulatively formed over the semiconductor layer 48, and a contact electrode 54 formed integrally with the gate electrode 52 and in electric contact with the semiconductor layer 48. The gate electrode 50 is formed integral with the contact electrode 46. The inverter I5 includes an n-type semiconductor layer 56 having the opposite ends thereof connected to the positive power supply terminal $+V_D$ and ground, gate electrodes 58 and 60 insulatively formed over the semiconductor layer 56, and a contact electrode 62 formed integrally with the gate electrode 58 and in electric contact with the semiconductor layer 56. The gate electrode 60 is integral with the contact region 54.

It is to be noted that since, in the semiconductor device shown in FIG. 9, a reverse bias voltage is applied between the p-type semiconductor layer 48 and the n-type semiconductor layers 40 and 56, the p-type semiconductor layer 48 can be formed on an insulating substrate (not shown) at least partly in contact with the n-type semiconductor layers 40 and 56. In this case, however, if the entire region of the p-type semiconductor layer 48 is made in contact with the n-type semiconductor layers 40 and 56 in substantially the entire surfaces facing each other, application of a positive voltage to the gate electrode 50, for instance, causes the n-type semiconductor layers 40 and 56 to be rendered conductive through the channel region beneath the gate electrode 50. In order to prevent such an undesired phenomenon, it is necessary that the p-type semiconductor layer 48 is at least partly separated from the n-type semiconductor layers 40 and 56. Even with this requirement, it is possible to form the p- and n-type semiconductor layers at least partly in contact with each other on the insulating substrate so as to reduce the area occupied by the semiconductor circuit by alternately arranging the n- and p-type semiconductor layers, connecting each n-type semiconductor layer between the positive power supply terminal and ground and connecting each p-type semiconductor layer between the negative power supply terminal and ground.

Figure 10:
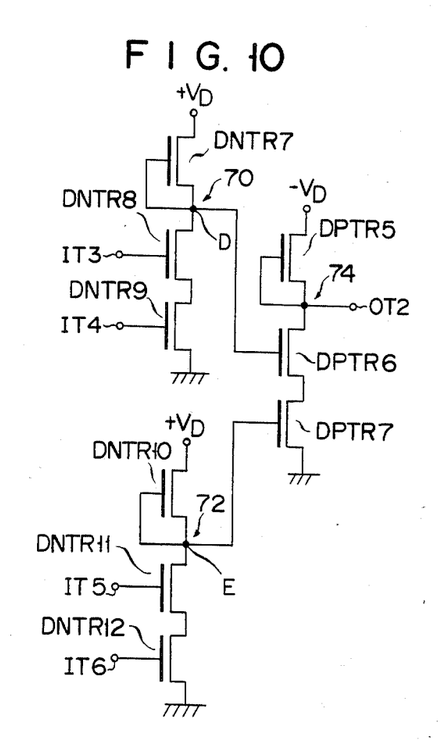
FIG. 10 is a circuit diagram showing a third embodiment of the semiconductor device according to the invention.
Figure 11:
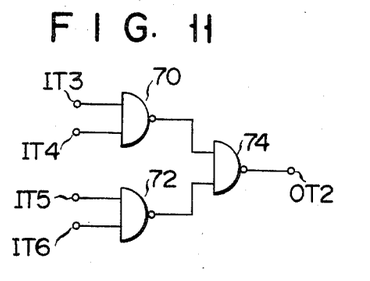
FIG. 11 is a circuit diagram showing a logic circuit constituted by semiconductor device shown in FIG. 10.

FIG. 10 shows a third embodiment of a semiconductor circuit according to the invention. This semiconductor circuit includes a NAND gate 70 including D-type n-channel MOS transistors DNTR7 to DNTR9 with the current paths thereof connected in series between a positive power supply terminal $+V_D$ and ground, a NAND gate 72 including D-type n-channel MOS transistors DNTR10 to DNTR12 with the current paths thereof serially connected between the positive power supply terminal $+V_D$ and ground, and a NAND gate 74 including D-type p-channel MOS transistors DPTR5 to DPTR7 with the current paths thereof serially connected between a negative power supply terminal $-V_D$ and ground. The NAND gate 70 has input terminals IT3 and IT4; the NAND gate 72 has input terminals IT5 and IT6; and the NAND gate 74 has input terminals connected to the output terminals D and E respectively of the NAND gates 70 and 72. The semiconductor circuit of FIG. 10 constitutes a logic gate circuit shown in FIG. 11.

Figure 12:
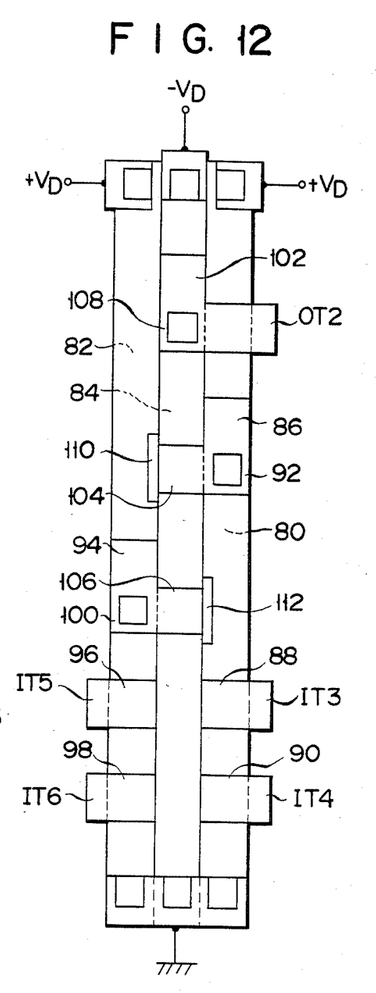
FIG. 12 shows a schematic plan view of the third embodiment of the semiconductor device shown in FIG. 10.

FIG. 12 shows a schematic plan view of the semiconductor device constituting the semiconductor circuit shown in FIG. 10. This semiconductor device includes n-type semiconductor layers 80 and 82 formed on an insulating substrate (not shown) and connected between a positive power source terminal $+V_D$ and ground and a p-type semiconductor layer 84 formed on the substrate between the semiconductor layers 80 and 82 and in electric contact therewith and connected between a negative power supply terminal $-V_D$ and ground. The NAND gate 70 shown in FIG. 10 includes gate electrodes 86, 88 and 90 insulatively formed over the n-type semiconductor layer 80 and a contact electrode 92 integral with the gate electrode 86 and in electric contact with the n-type semiconductor layer 80. The NAND gate 72 includes gate electrodes 94, 96 and 98 insulatively formed over the n-type semiconductor layer 82 and a contact electrode 100 integral with the gate electrode 94 and in electric contact with the n-type semiconductor layer 82. The NAND gate 74 includes gate electrodes 102, 104 and 106 insulatively formed over the p-type semiconductor layer 84 and a contact electrode 108 integral with the gate electrode 102 and in electric contact with the p-type semiconductor layer 84. The gate electrodes 104 and 106 are respectively formed integral with the contact electrodes 92 and 100.

In order to prevent the n-type semiconductor layers 80 and 82 from being electrically connected through the gate electrodes 104 and 106 when the MOS transistors DPTR6 and DPTR7 are rendered nonconductive with application of a positive voltage, respectively, to these gate electrodes 104 and 106, insulating regions 110 and 112 are formed in portions of the respective n-type semiconductor layers 82 and 80 adjacent to the gate electrodes 104 and 106. The p-type semiconductor layer 84 is formed in contact with the n-type semiconductor layers 82 and 80 except for portions where the insulating regions 110 and 112 are formed. Since the opposite polarity voltages are respectively applied to the p-type semiconductor layer 84 and the n-type semiconductor layers 80 and 82, the NAND gates 70, 72 and 74 will not affect one another in operation, and also since the p-type semiconductor layer 84 can be formed in contact with the n-type semiconductor layers 80 and 82 almost over its entire region, the integration density can be improved.

Figure 13:
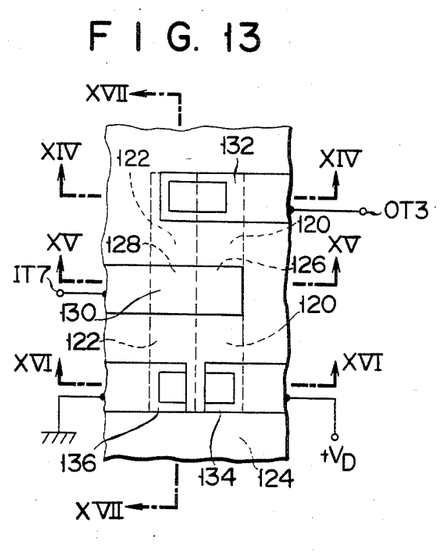
FIG. 13 is a schematic plan view of a fourth embodiment of a semiconductor device according to the invention.
Figure 14:
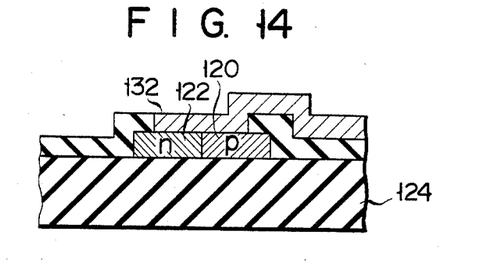
FIGS. 14 to 17 are sectional views taken along lines XIV—XIV to XVII—XVII in FIG. 13.
Figure 15:
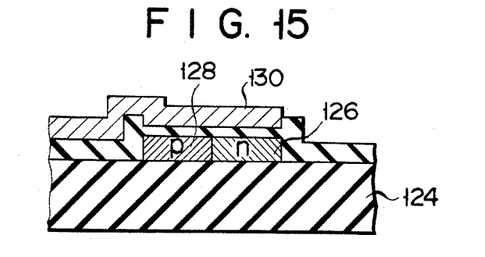
Figure 16:
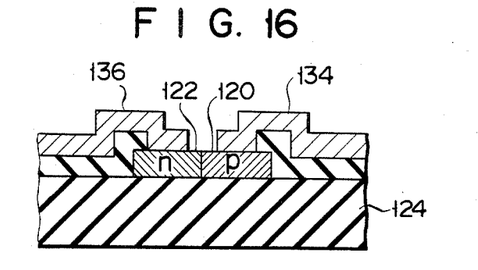
Figure 17:
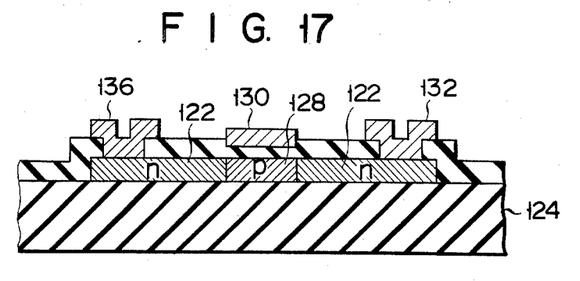
Figure 18:
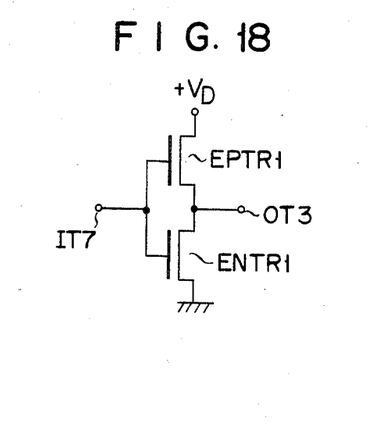
FIG. 18 is an equivalent circuit diagram of the semiconductor device shown in FIG. 17.

FIG. 13 is a schematic plan view of a further embodiment of the semiconductor device according to the invention, FIGS. 14 to 17 are sectional views taken along lines XIV—XIV, XV—XV, XVI—XVI and XVII—XVII in FIG. 13, and FIG. 18 is an equivalent circuit diagram of the semiconductor device shown in FIGS. 13 to 17. This semiconductor device includes p- and n-type semiconductor layers 120 and 122 respectively formed on an insulating substrate 124 and in contact with each other, as clearly shown in FIGS. 13, 14 and 16, and n- and p-type semiconductor regions 126 and 128 respectively formed in central regions of the respective p- and n-type semiconductor regions 120 and 122 and in contact with each other, and a gate electrode 130 formed insulatively over the n- and p-type semiconductor regions 126 and 128, respectively as clearly shown in FIGS. 15 and 17. The device further includes a conductive layer 132 in electric contact with an end portion of each of the p- and n-type semiconductor layers 120 and 122, respectively an electrode 134 in electric contact with the other end portion of the p-type semiconductor layer 120 and connected to a positive power supply terminal $+V_D$, and an electrode 136 in electric contact with the other end portion of the n-type semiconductor layer 132 and connected to ground. Thus, the p-type semiconductor layer 120, n-type semiconductor layer 126 and gate electrode 130 constitute an enhancement type (E-type) p-channel MOS transistor EPTR1 as shown in FIG. 18, and the n-type semiconductor layer 122, p-type semiconductor layer 128 and gate electrode 130 constitute an E-type n-channel MOS transistor ENTR1.

It is to be noted here that since the voltage applied to the positive power supply terminal $+V_D$ is set to be lower than the contact potential difference at the junction between the p- and n-type semiconductor layers 120 and 122, the MOS transistors EPTR1 and ENTR1 will not affect each other in operation, though the p- and n-type semiconductor layers 120 and 122 respectively are formed in contact with each other. For example, where the p- and n-type semiconductor layers 120 and 122 respectively are formed of silicon, application of a voltage lower than 0.5 V to the positive power supply terminal $+V_D$ causes the semiconductor layers 120 and 122 to be electrically isolated from each other, though a forward voltage is applied between the semiconductor layers 120 and 122 which are in contact with each other.

Figure 19:
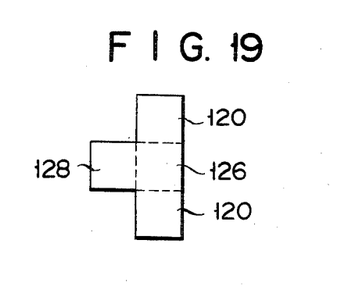
FIGS. 19 and 20 are views illustrating the improvement of the operation speed of the semiconductor device shown in FIG. 13.
Figure 20:
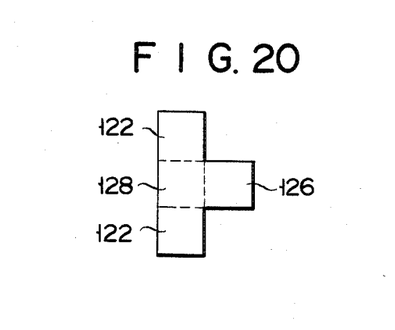

For operating the CMOS inverter shown in FIG. 18 with such a low voltage, it is necessary to precisely set the threshold voltage of the p- and n-channel MOS transistors EPTR1 and ENTR1 to a very low value, for instance 0.2 V. To this end, it is required to form the gate insulation film to be sufficiently thin and to control the impurity concentration of each channel region with high precision, but this requirement can be well satisfied using the present semiconductor manufacturing techniques. In another aspect, with the use of the low voltage, the operation speed of the CMOS inverter is inevitably low, but it is possible to greatly improve the operation speed by using the present semiconductor manufacturing techniques. Further, with the semiconductor device shown in FIGS. 13 to 17, where the n- and p-type channel regions 126 and 128 respectively are contiguous to each other, when the MOS transistors EPTR1 and ENTR1 are rendered conductive, the effective areas of the channel regions of these MOS transistors EPTR1 and ENTR1 are expanded as shown in FIGS. 19 and 20, respectively, and this has the effect of increasing the operation speed of the CMOS inverter.

Figure 21:
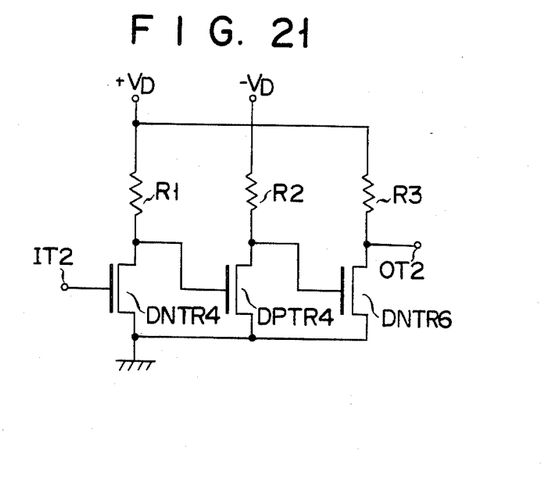
FIG. 21 is a circuit diagram showing a modification of the semiconductor circuit shown in FIG. 8.
Figure 22:
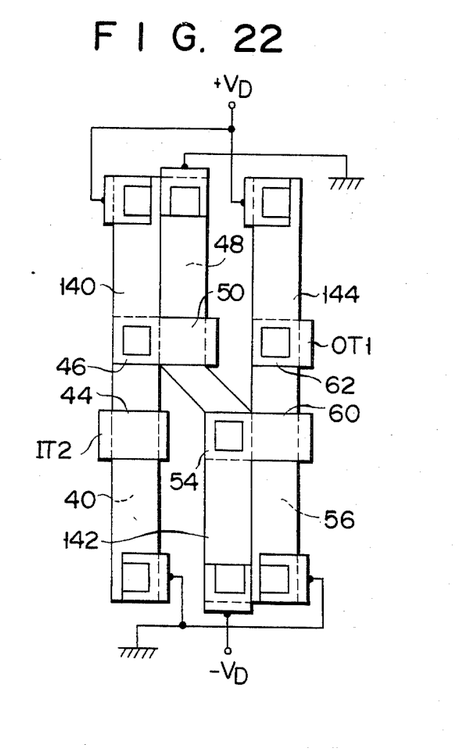
FIG. 22 shows a schematic plan view showing a semiconductor device constituting the circuit shown in FIG. 21.

FIG. 21 shows a modification of the semiconductor circuit shown in FIG. 8. This circuit is the same as the circuit of FIG. 8 except that resistors R1, R2 and R3 are used in lieu of the respective MOS transistors DNTR3, DPTR3 and DNTR5. FIG. 22 shows a semiconductor device which constitutes the semiconductor circuit shown in FIG. 21. This device is again the same as the device shown in FIG. 9 except that the electrodes 42, 52 and 58 of FIG. 9 are omitted and polycrystalline silicon layers 140, 142 and 144 are formed instead of part of the respective semiconductor layers 40, 48 and 56. The polycrystalline silicon layer 140 is connected between the contact electrode 46 and positive power supply terminal $+V_D$ and constitutes the resistor R1 in FIG. 21; the polycrystalline silicon layer 142 is connected between the contact electrode 54 and negative power supply terminal $-V_D$ and constitutes the resistor R2; and the polycrystalline silicon layer 144 is connected between the contact electrode 62 and positive power supply terminal $+V_D$ and constitutes the resistor R3. The semiconductor device shown in FIG. 22 has substantially the same effects as the device shown in FIG. 9.

Figure 23:
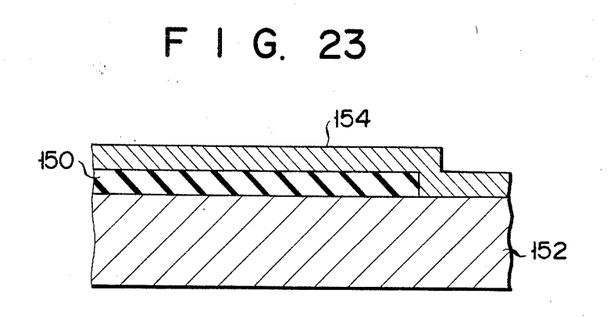
FIG. 23 is a sectional view of a semiconductor structure which may be used when a semiconductor device according to the invention is constructed by using an insulating film formed on a semiconductor substrate.

While some preferred embodiments of the invention have been described in the foregoing, they are by no means limitative. For example, while in the above embodiments a sapphire substrate has been used as the insulating substrate, any other substrate may also be used so long as it is substantially insulative. For example, a GaAs substrate of high resistivity may be used for forming MOS transistors thereon. Further, it is possible to use an $SiO_2$ film 150 formed on a silicon substrate 152 as shown in FIG. 23 in lieu of the insulating substrate. In this case, a monocrystalline or polycrystalline silicon layer 154 may be formed on the $SiO_2$ film 150 partly in contact with the silicon substrate 152, and MOS transistors can be formed by making use of the silicon layer 154.

Figure 24:
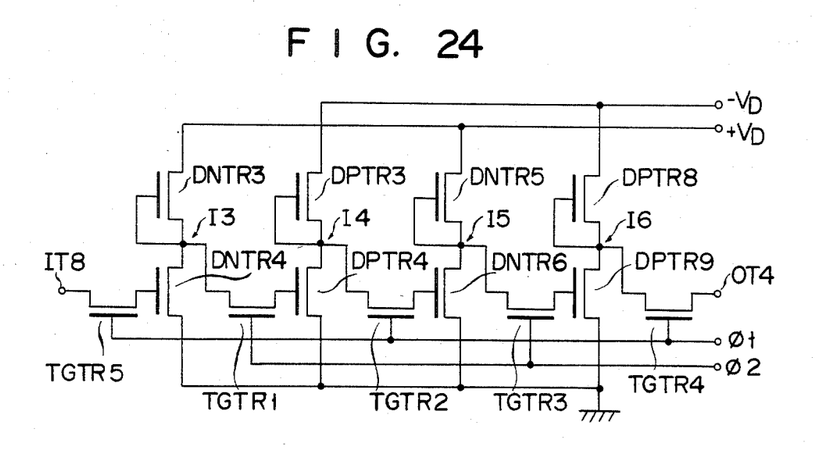
FIG. 24 is a circuit diagram of another embodiment of a semiconductor device according to the invention.

Further, in the embodiment of FIG. 8 three inverters are cascade-connected, but it is also possible to alternately arrange inverters constituted by p-type MOS transistors and inverters constituted by n-type MOS transistors and connect a desired number of those different type inverters in a cascade fashion. FIG. 24 shows an example, in which four inverters I3 to I6 are connected in cascade fashion. Here, the inverters I3 to I5 are the same as those in the circuit of FIG. 8, and the inverter I6 is constituted by D-type p-channel MOS transistors DPTR8 and DPTR9. These inverters I3 to I6 are not directly coupled together, but they are respectively connected in sequence to one another and to an output terminal OT4 through transfer gate MOS transistors TGTR1 to TGTR4. Further, an input terminal IT8 is connected through a transfer gate MOS transistor TGTR5 to the inverter I3. Here, the MOS transistors TGTR2, TGTR4 and TGTR5 are p-type transistors and controlled by a clock signal $\phi 1$, while the MOS transistors TGTR1 and TGTR3 are n-type transistors and controlled by a clock signal $\phi 2$. Thus, the circuit of FIG. 24 functions as a shift register for sequentially shifting the input signal according to the control clock signal $\phi 1$ and $\phi 2$.

In constructing the circuit shown in FIG. 4, it is possible to form the p- and n-type semiconductor layers which are main elements of the inverters I3 to I6 on an insulating substrate in contact with one another. Further, in the circuit of FIG. 24 the transfer gate MOS transistors TGTR1 and TGTR5 may be either of the D-type or E-type, and the polarity and voltage level of the clock signals $\phi 1$ and $\phi 2$ may be selected in accordance with the type of these transistors.

Figure 25:
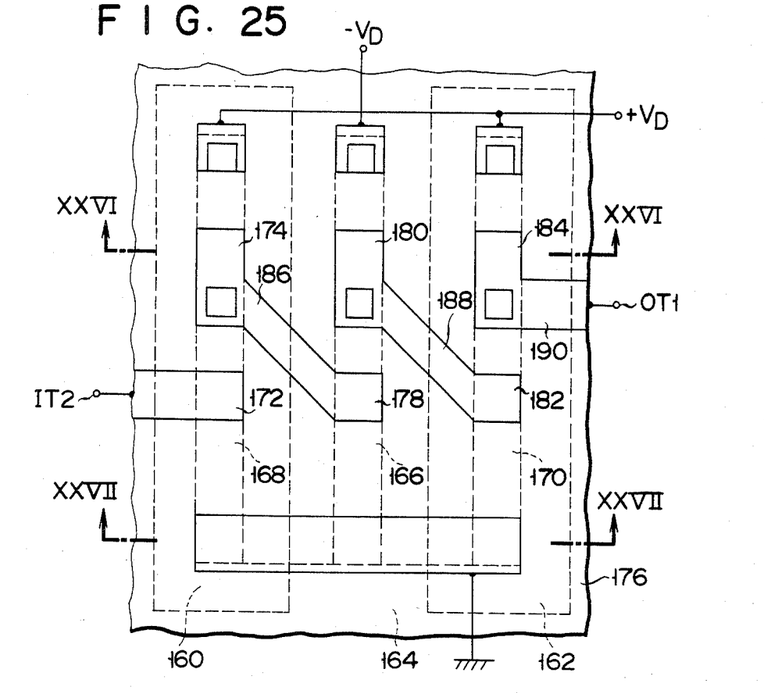
FIG. 25 is a schematic plan view showing a further embodiment of the semiconductor device according to the invention.
Figure 26:
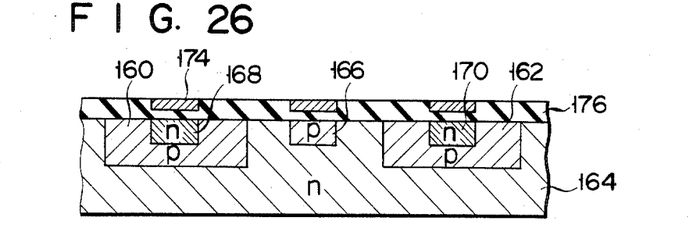
FIGS. 26 and 27 are sectional views respectively taken along lines XXVI—XXVI and XXVII—XXVII in FIG. 25.
Figure 27:
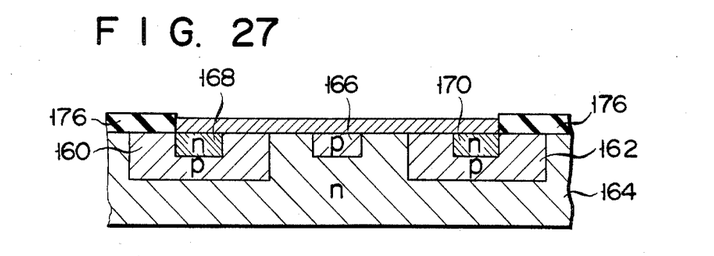

Further, the circuit shown in FIG. 8 may also be formed by using an ordinary semiconductor substrate as shown in FIGS. 25 to 27. In the semiconductor device shown in FIGS. 25 to 27, p-type wells 160 and 162 are formed in parallel in the surface area of an n-type semiconductor substrate 164, and also a p-type semiconductor region 166 is formed in the surface area of the substrate 166 such that it extends between the p-type wells 160 and 162 spaced apart therefrom. In the p-type wells 160 and 162, n-type semiconductor regions 168 and 170 are formed respectively. Over the n-type semiconductor layer 168, gate electrodes 174 and 172 are formed on an insulating layer 176 to form D-type MOS transistors DNTR3 and DNTR4 respectively over the p-type semiconductor layer 166 gate electrodes 180 and 178 are formed on an insulating layer 176 to form D-type MOS transistors DPTR3 and DPTR4 respectively and over the n-type semiconductor layer 170 gate electrodes 184 and 182 are formed on an insulating layer 176 to form D-type MOS transistors DNTR5 and DNTR6 respectively.

The gate electrodes 174 and 178 are electrically connected to each other by a conductive layer 186 which is in electric contact with the n-type semiconductor region 168; the gate electrodes 180 and 182 are electrically connected to each other by a conductive layer 188 which is in electric contact with the p-type semiconductor region 166; and the gate electrode 184 is connected to the output terminal OT1 by a conductive layer 190 in electric contact with the n-type semiconductor region 170. The n-type semiconductor regions 168 and 170 are each connected at one end thereof to the positive power supply terminal $+V_D$, and the p-type semiconductor region 166 is connected at one end to the negative power supply terminal $-V_D$. The opposite ends of semiconductor regions 166, 168 and 170 are grounded. The semiconductor device which is thus formed by using the semiconductor substrate executes substantially the same operation as the semiconductor device using the sapphire substrate as shown in FIG. 2.

Further, while the above embodiments have concerned inverter combination circuits and NAND gate combination circuits, it is also possible to construct combination circuits of NOR gates combination circuits of inverters, NAND gates and NOR gates according to the invention.

Figure 6:
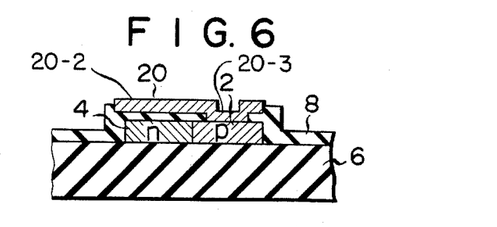

Further, the process of manufacturing the semiconductor device shown in FIGS. 2 and 6 has been described with reference to FIGS. 7A to 7E, for illustrative purposes only, as it is also possible to fabricate the semiconductor device according to the invention by various other processes. Further, while in the above embodiments other than the embodiments of FIGS. 13 to 20, D-type MOS transistors have been used, it is also possible to use E-type MOS transistors instead of D-type MOS transistors in these embodiments.

Further, throughout the specification the first channel type or second channel type MOS transistor section should not be construed to always mean a single MOS transistor but sometimes mean a plurality of MOS transistors such as the MOS transistors DNTR8 and DNTR9, MOS transistors DNTR11 and DNTR12, or MOS transistors DPTR6 and DPTR7 shown in FIG. 10. Further, the terms "lower" and "higher" are used with respect to potential in mathematical sense. Accordingly, it should be understood that a reverse bias voltage is applied across the pn junction by setting the p-type region at a first potential and setting the n-type region at a second potential which is higher than the first potential.

What is claimed is:

1. A semiconductor device comprising:
   an insulating body formed of substantially an insulating material;
   a p-type semiconductor region formed on said insulating body and constituting at least part of a first semiconductor circuit section;
   an n-type semiconductor region formed on said insulating body and constituting at least part of a second semiconductor circuit section, at least part of said n-type semiconductor region being in contact with said p-type semiconductor region;
   first potential setting means connected to said p-type semiconductor region to set the p-type semiconductor region at a first predetermined operation potential; and
   second potential setting means connected to said n-type semiconductor region to set the n-type semiconductor region at a second preferred operation potential higher than the first predetermined operation potential, thereby electrically isolating said p-type and said n-type semiconductor regions from each other.

2. A semiconductor device according to claim 1, wherein said first and second semiconductor circuit sections each includes at least one MOS transistor.

3. A semiconductor device according to claim 1, wherein said first semiconductor circuit section includes at least one depletion type p-channel MOS transistor and said second semiconductor circuit section includes at least one depletion type n-channel MOS transistor.

4. A semiconductor device according to claim 1, wherein said first semiconductor circuit section includes at least one MOS transistor constituting a first inverter and said second semiconductor circuit section includes at least one MOS transistor constituting a second inverter, said first and second inverters being cascade-connected.

5. A semiconductor device according to claim 1, wherein said first and second semiconductor circuit sections have a plurality of MOS transistors combined to constitute a flip-flop circuit.

6. A semiconductor device according to claim 1, wherein said first semiconductor circuit section has a plurality of MOS transistors constituting a first logic gate circuit and said second semiconductor circuit section has a plurality of MOS transistors constituting a second logic gate circuit, said first and second logic gate circuits being cascade-connected.

7. A semiconductor device according to claim 6, wherein said MOS transistors are of the depletion type.

8. A semiconductor device comprising:
   an insulating body formed of substantially an insulating material;
   a p-type semiconductor region formed on said insulating body and constituting at least part of a first semiconductor circuit section;
   an n-type semiconductor region formed on said insulating body and constituting at least part of a second semiconductor circuit section, said n-type semiconductor region being at least partly in contact with said p-type semiconductor region;
   first potential setting means connected to said p-type semiconductor region to set the p-type semiconductor region at a first predetermined operation potential; and
   second potential setting means connected to said n-type semiconductor region to set the n-type semiconductor region at a second predetermined operation potential being lower than the first predetermined operation potential, the difference between the first and second potentials being not larger than the contact potential difference at the junction between said p-type and n-type semiconductor regions, thereby electrically isolating said p-type and said n-type semiconductor regions from each other.

9. A semiconductor device according to claim 8, wherein said first and second semiconductor circuit sections each includes at least one MOS transistor.

10. A semiconductor device according to claim 8, wherein said first semiconductor circuit section has a p-channel MOS transistor having a source and a drain formed in said p-type semiconductor region, and said second semiconductor circuit section has an n-channel MOS transistor having a source and a drain formed in said n-type semiconductor region, said p- and n-type MOS transistors constituting a complementary MOS inverter.

11. A semiconductor device according to claim 10, wherein said p- and n-channel MOS transistors are of the enhancement type, and the channel regions of said p- and n-type regions are in contact with each other.

12. A semiconductor device comprising:
   an insulating body formed of substantially an insulating material;
   at least one p-type semiconductor region formed on said insulating body;
   at least one n-type semiconductor region formed on said insulating body and at least partly in contact with said at least one p-type semiconductor region;
   a first gate electrode section formed insulatively over said p-type semiconductor region to constitute a p-channel MOS transistor section;
   a second gate electrode section formed insulatively over said one n-type semiconductor region to constitute an n-channel MOS transistor section;
   a first power supply terminal connected to said one p-type semiconductor region and set at a first predetermined operation potential; and
   a second power supply terminal connected to said one n-type semiconductor region, and set at a second predetermined operation potential which is higher than the first predetermined operation potential, thereby electrically isolating said p-type and said n-type semiconductor regions from each other.

13. A semiconductor device according to claim 12, wherein said first gate electrode section has two gate electrodes constituting two MOS transistors with the current paths connected in series.

14. A semiconductor device according to claim 12 or 13, wherein said second gate electrode section has two gate electrodes constituting two MOS transistors with the current paths connected in series.

15. A semiconductor device comprising:
an insulating body formed of substantially an insulating material;
at least one p-type semiconductor region formed on said insulating body
at least one n-type semiconductor region formed on said insulating body and at least partly in contact with said at least one p-type semiconductor region;
a first gate electrode section formed insulatively over said one p-type semiconductor region to constitute a p-channel MOS transistor section;
a second gate electrode section formed insulatively over said one n-type semiconductor region to constitute an n-channel MOS transistor section;
a first power supply terminal which is connected to said one p-type semiconductor region and which is set at a first predetermined operation potential; and
a second power supply terminal which is connected to said one n-type semiconductor region and which is set at a second predetermined operation potential lower than the first predetermined operation potential, the difference between the first and second predetermined operation potentials being not larger than the contact potential difference at the junction between said p- and n-type semiconductor regions, thereby electrically isolating said p-type and said n-type semiconductor regions from each other.

16. A semiconductor device according to claim 15, wherein said first gate electrode section has two gate electrodes constituting two MOS transistors with the current paths connected in series.

17. A semiconductor device according to claim 15 or 16, wherein said second gate electrode section has two gate electrodes constituting two MOS transistors with the current paths connected in series.

18. A semiconductor device according to claim 1 comprising:
first and second power supply terminals which are respectively set at first and second potentials of different levels;
a first semiconductor circuit section connected to said first power supply terminal for generating an output signal having a potential level between said first potential and a third potential according to an input signal having a potential level between said second and third potentials, said third potential being at a level between the levels of said first and second potentials; and
a second semiconductor circuit section connected to said second power supply terminal for generating an output signal having a potential level between said second and third potentials according to the output signal from said first semiconductor circuit section.

19. A semiconductor circuit according to claim 18, wherein said first semiconductor circuit section includes a first load having one end connected to said first power supply terminal and a first MOS transistor having a drain connected to the other end of said first load, a gate to which the input signal is supplied and a source to which said third potential is applied, and also wherein said second semiconductor circuit section includes a second load having one end connected to said second power supply terminal and a second MOS transistor having a drain connected to the other end of said second load and a gate and a source respectively connected to the drain and source of said first MOS transistor, said second MOS transistor having a different channel from the channel of said first MOS transistor.

20. A semiconductor circuit according to claim 19, wherein said first and second MOS transistors are of the depletion type.

21. A semiconductor circuit according to claim 19, wherein said first load is a MOS transistor having a threshold voltage of the absolute value smaller than the absolute value of the threshold voltage of said first MOS transistor, and said second load is a MOS transistor having a threshold voltage of the absolute value smaller than the absolute value of the threshold voltage of said second MOS transistor.

22. A semiconductor circuit according to claim 19, wherein said first and second loads are resistors.

23. A semiconductor circuit according to claim 19, wherein said first and second power supply terminals are respectively positive and negative power supply terminals.

24. A semiconductor circuit according to claim 19, wherein the drain of said first MOS transistor is directly connected to the gate of said second MOS transistor.

25. A semiconductor circuit according to claim 19, which further comprises an MOS transistor having the current path thereof connected between the drain of said first MOS transistor and the gate of said second MOS transistor.

26. A semiconductor circuit according to claim 19, wherein the drain of said second MOS transistor is connected to the gate of said first MOS transistor.

27. A semiconductor circuit according to claim 19, wherein said first and second MOS transistors and said first and second loads are formed as a silicon-on-sapphire structure.

28. A semiconductor circuit according to claim 18, wherein said first semiconductor circuit section includes a first load having one end connected to said first power supply terminal and at least one first logic gate circuit constituted by a first MOS transistor circuit having a plurality of MOS transistors with the current paths connected in series with one another and with said first load, and said second semiconductor circut section includes a second load having one end connected to said second power supply terminal and a second logic gate circuit constituted by a second MOS transistor circuit having a plurality of MOS transistors with the current paths connected in series with one another and with said second load, the output signal from said first logic gate circuit being received at one of the gates of the MOS transistors of said second logic circuit.

29. A semiconductor device comprising:
an insulation body formed of substantially insulative material;
a first semiconductor region of one conductivity type formed on said insulation body to comprise at least part of a first semiconductor circuit section;
a second semiconductor region having a conductivity type opposite to that of said first semiconductor region and formed at least partly in contact with said first semiconductor region on said insulation body to comprise at least part of second semiconductor circuit section; and first and second power source terminals respectively connected to said first and second semiconductor regions, a voltage being applied between said first and second power source terminals to apply a reverse bias voltage between said first and second semiconductor regions.

30. A semiconductor device comprising:

an insulating body formed of substantially an insulating material;

a p-type semiconductor region formed on said insulating body and constituting at least part of a first semiconductor circuit section;

an n-type semiconductor region formed on said insulating body and constituting at least part of a second semiconductor circuit section, with at least part of said n-type semiconductor region being in contact with said p-type semiconductor region;

first potential setting means connected to said p-type semiconductor region for setting one end of said p-type semiconductor region at a first predetermined operation potential;

reference potential setting means connected to said p-type and n-type semiconductor regions for setting the other end of said p-type semiconductor region and one end of said n-type semiconductor region at a reference potential higher than the first predetermined operation potential; and second potential setting means continuously connected to said n-type semiconductor region for setting the other end of said n-type semiconductor region at a second predetermined operation potential higher than the reference potential, and for electrically isolating said p-type and said n-type semiconductor regions from each other.

* * * * *

UNITED STATES PATENT AND TRADEMARK OFFICE
CERTIFICATE OF CORRECTION

PATENT NO. : 4,547,790

DATED : October 15, 1985

INVENTOR(S) : Hideharu Egawa

It is certified that error appears in the above-identified patent and that said Letters Patent is hereby corrected as shown below:

Claim 1, line 37, change "preferred" to -- predetermined --.

Signed and Sealed this

Thirteenth Day of May 1986

[SEAL]

Attest:

DONALD J. QUIGG

Attesting Officer

Commissioner of Patents and Trademarks